United States Patent
Wickham et al.

(10) Patent No.: US 11,261,521 B2
(45) Date of Patent: Mar. 1, 2022

(54) THICK OPTICAL QUALITY SYNTHETIC POLYCRYSTALLINE DIAMOND MATERIAL WITH LOW BULK ABSORPTION AND LOW MICROFEATURE DENSITY

(71) Applicant: ELEMENT SIX TECHNOLOGIES LIMITED, Didcot (GB)

(72) Inventors: Benjamin Wickham, Didcot (GB); Andrew Michael Bennett, Didcot (GB)

(73) Assignee: Element Six Technologies LTD, Didcot (GB)

( * ) Notice: Subject to any disclaimer, the term of this patent is extended or adjusted under 35 U.S.C. 154(b) by 18 days.

(21) Appl. No.: 16/064,337

(22) PCT Filed: Nov. 25, 2016

(86) PCT No.: PCT/EP2016/078802
§ 371 (c)(1),
(2) Date: Jun. 20, 2018

(87) PCT Pub. No.: WO2017/108328
PCT Pub. Date: Jun. 29, 2017

(65) Prior Publication Data
US 2019/0003043 A1 Jan. 3, 2019

(30) Foreign Application Priority Data
Dec. 21, 2015 (GB) .................................. 1522502

(51) Int. Cl.
*C23C 16/27* (2006.01)
(52) U.S. Cl.
CPC .................................. *C23C 16/274* (2013.01)
(58) Field of Classification Search
CPC .................................................... C23C 16/274
(Continued)

(56) References Cited

U.S. PATENT DOCUMENTS

| 5,286,524 A | 2/1994 | Slutz et al. |
| 6,319,439 B1 | 11/2001 | Lee et al. |

(Continued)

FOREIGN PATENT DOCUMENTS

| GB | 2476478 A | 6/2011 | |
| GB | 2523881 A * | 9/2015 | ........... C30B 25/105 |

(Continued)

OTHER PUBLICATIONS

Davies, A. R., et al., "The solid particle erosion of free-standing CVD diamond," Wear, Jan. 1, 2002, pp. 96-102, vol. 252, XP055358928, Elsevier.

(Continued)

*Primary Examiner* — Tahseen Khan
(74) *Attorney, Agent, or Firm* — Kilpatrick Townsend & Stockton LLP

(57) ABSTRACT

A poly crystalline chemical vapour deposited (CVD) diamond wafer comprising: —a diameter >40 mm; —a thickness >1.0 mm; —an absorption coefficient ≤0.1 cm$^{-1}$ at 10.6 µm; and •a micro feature density, especially in the form of "black spots", meeting the following specification: —in a central area of the polycrystalline CVD diamond wafer from 0 to 20 mm radius there are no more than 100 micro features of a size between 0.002 and 0.008 mm$^2$, no more than 50 micro features of a size between 0.008 and 0.018 mm$^2$, no more than 25 microfeatures of a size between 0.018 and 0.05 mm$^2$, and zero microfeatures of a size between 0.05 and 0.1 mm$^2$, and •in an outer region of the polycrystalline CVD diamond wafer from 20 to 40 mm radius there are no more than 200 microfeatures 2 of a size between 0.002 and 0.008 mm$^2$, no more than 150 microfeatures of a size between 0.008 and 0.018 mm$^2$, no more than 100 microfeatures of a size between 0.018 and 0.05 mm$^2$, and zero microfeatures of a size between 0.05 and 0.1 mm$^2$.

9 Claims, 1 Drawing Sheet

(58) Field of Classification Search
USPC .......................................................... 428/156
See application file for complete search history.

(56) References Cited

U.S. PATENT DOCUMENTS

| | | | | |
|---|---|---|---|---|
| 2014/0234556 A1* | 8/2014 | Dodge | ............... | H01J 37/32284 427/575 |
| 2014/0342122 A1* | 11/2014 | Inglis | ................. | C23C 16/4586 428/141 |
| 2014/0349068 A1* | 11/2014 | Inglis | ................. | C23C 16/4586 428/141 |
| 2015/0222087 A1* | 8/2015 | Williams | ................ | C23C 16/52 428/64.1 |

FOREIGN PATENT DOCUMENTS

| | | | | |
|---|---|---|---|---|
| GB | 2523881 | A | | 9/2015 |
| GB | 2497671 | B | | 6/2016 |
| JP | 2009209028 | A | | 9/2009 |
| WO | 2012084655 | A2 | | 6/2012 |
| WO | 2012084656 | A1 | | 6/2012 |
| WO | 2012084657 | A1 | | 6/2012 |
| WO | 2012084658 | A1 | | 6/2012 |
| WO | 2012084659 | A1 | | 6/2012 |
| WO | 2012084661 | A1 | | 6/2012 |
| WO | 2013087702 | A2 | | 6/2013 |
| WO | 2013087797 | A1 | | 6/2013 |
| WO | 2013178535 | A2 | | 12/2013 |
| WO | WO-2014026930 | A1 | * 2/2014 | ........... C23C 16/274 |
| WO | 2014135544 | A1 | | 9/2014 |
| WO | 2014135547 | A1 | | 9/2014 |

OTHER PUBLICATIONS

Friel, Ian, "Optical Quality Diamond Grown by Chemical Vapor Deposition," Optical Engineering of Diamond, Mar. 28, 2013, pp. 35-69, XP055358921, Wiley-VCH Verlad GmbH & Co.

Balmer, R.S., et al., "Chemical vapour deposition synthetic diamond: materials, technology and applications," Journal of Physics: Condensed Matter, Aug. 19, 2009, pp. 1-23, vol. 21, IOP Publishing Ltd, United Kingdom.

Dodson, J. M., et al., "Single crystal and polycrystalline CVD diamond for demanding optical applications," Window and Dome Technologies and Materials XII, Proceedings of SPIE, May 13, 2011, pp. 80160L-1-80160L-11, vol. 8016, XP060014237, SPIE.

Bennett, Andrew M., et al., "CVD Diamond for high power laser applications," Proceedings of SPIE, Feb. 22, 2013, pp. 860307-1-860307-10, vol. 8603, XP055119388, SPIE.

United Kingdom Patent Application No. GB1522502.2, Search Report dated Aug. 30, 2016, 6 pages.

United Kingdom Patent Application No. GB1619944.0, Search Report dated Jun. 9, 2017, 4 pages.

International Patent Application No. PCT/EP2016/078802, International Search Report and Written Opinion dated Apr. 5, 2017, 15 pages.

Davies, A. R., et al., "Strength of free-standing chemically vapour-deposited diamond measured by a range of techniques," Philosophical Magazine, Dec. 21, 2003, pp. 4059-4070, vol. 83, No. 36, Taylor & Francis Group.

Stover, John C., "Optical Scattering: Measurement and Analysis, Second Edition," 1995, The Society of Photo-Optical Instrumentation Engineers.

Turri, Giorgio, et al., "Optical Absorption, Depolarization, and Scatter of Epitaxial Single-Crystal Chemical-Vapor-Deposited Diamond at 1.064 µm," Optical Engineering, Jun. 2007, pp. 064002-1-064002-10, vol. 46, No. 6, Society of Photo-Optical Instrumentation Engineers (SPIE).

Twitchen, D. J., et al., "Thermal conductivity measurements on CVD diamond," Diamond and Related Materials, 2001, pp. 731-735, vol. 10, Elsevier Science B.V.

Yang, J. X., et al., "The influence of dark feature on optical and thermal property of DC Arc Plasma Jet CVD diamond films," Jun. 17, 2005, pp. 1583-1587, vol. 14, No. 10, Elsevier Science Publishers, Amsterdam, ISSN: 09259635.

ISO 11551, "Optics and optical instruments—Lasers and laser-related equipment—Test method for absorptance of optical laser components," Jul. 15, 1997, First Edition, CEN Central Secretariat, Brussels, Belgium.

* cited by examiner

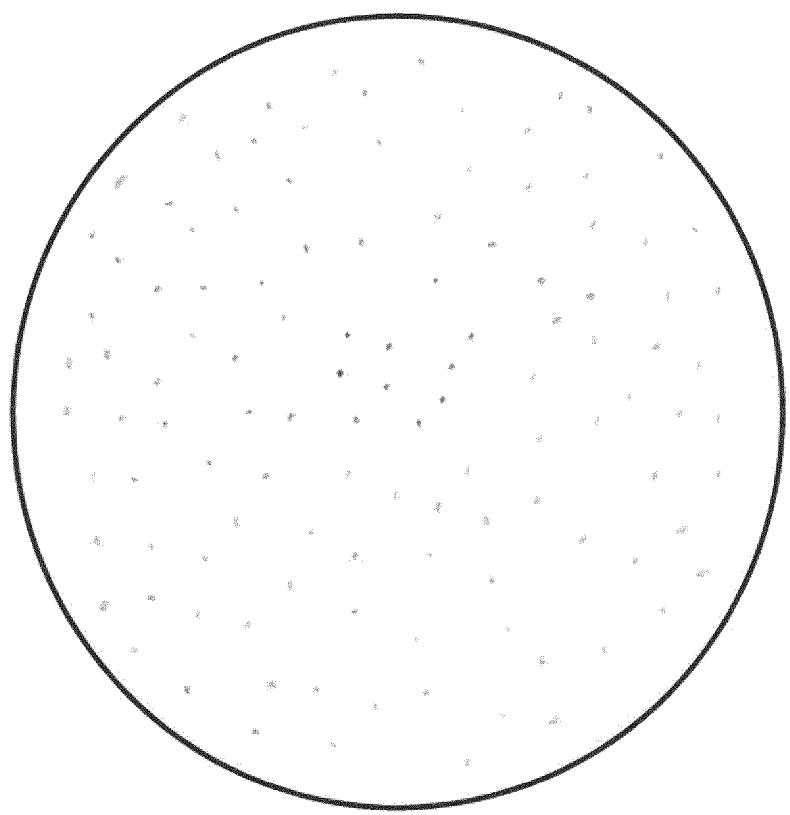

THICK OPTICAL QUALITY SYNTHETIC POLYCRYSTALLINE DIAMOND MATERIAL WITH LOW BULK ABSORPTION AND LOW MICROFEATURE DENSITY

FIELD OF INVENTION

The present invention relates to the fabrication of optical quality synthetic polycrystalline diamond material using a chemical vapour deposition (CVD) technique. In particular, the present invention is concerned with the fabrication of polycrystalline CVD diamond wafers which have a low bulk absorption coefficient and which also have a low density of micro features.

BACKGROUND OF INVENTION

Chemical vapour deposition (CVD) processes for synthesis of diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Diamond material is useful as an optical component as it has a broad optical transparency from ultraviolet through to infrared. Diamond material has the additional advantage over other possible window materials in that it is mechanically strong, chemically inert, and biocompatible. For example, the inertness of diamond material makes it an excellent choice for use in reactive chemical environments where other optical window materials would not be suitable. Further still, diamond material has very high thermal conductivity and a low thermal expansion coefficient. As such, diamond material is useful as an optical component in high energy beam applications where the component will tend to be heated. The diamond material will rapidly conduct away heat to cool areas where heating occurs so as to prevent heat build-up at a particular point, e.g. where a high energy beam passes through the material. To the extent that the material is heated, the low thermal expansion coefficient of diamond material ensures that the component does not unduly deform which may cause optical and/or mechanical problems in use.

One problem with fabricating polycrystalline CVD diamond optical components is that during the CVD growth process defects and/or impurities such as nitrogen, silicon and non-diamond carbon are incorporated into the diamond material as discussed below.

Atmospheric nitrogen is generally present as an impurity within source process gases and may also be present as a residual impurity within CVD reactor components due, for example, to non-perfect vacuum seals and/or residual defects and/or impurities adsorbed onto interior surfaces of the CVD reactor which may desorb during use. Furthermore, nitrogen gas is often intentionally introduced into the CVD synthesis atmosphere during a synthetic diamond growth process to increase growth rate. However, incorporation of nitrogen into the synthetic diamond material can detrimentally affect the optical and thermal performance characteristics of the material. Accordingly, a balance may be struck between providing sufficient nitrogen within the CVD synthesis atmosphere to impact factors such as growth texture while limiting the quantity of nitrogen which is incorporated into the solid CVD diamond material being grown. Apparatus and process conditions can affect the rate at which nitrogen within the CVD synthesis atmosphere is incorporated into the solid CVD diamond material being grown.

Silicon defects and/or impurities may come from silicon based components within the CVD reactor. For example, quartz windows or bell jars are often used to couple microwaves into the plasma chamber and/or constrain plasma and process gases near a substrate growth surface to achieve CVD diamond growth. Such silicon containing quartz components are exposed to extreme temperatures from the plasma in use and this can result in silicon from these components being incorporated into the synthetic diamond material. Apparatus and process conditions can affect the rate at which silicon is incorporated into the solid CVD diamond material being grown. Boron is also a common impurity in reactor and substrate materials which can impact diamond texture, growth rates, and material quality.

Non-diamond carbon (e.g. sp2 hybridized graphitic carbon) is inevitably deposited on the growth surface of the substrate during CVD diamond growth processes. Atomic hydrogen is essential to a CVD diamond growth process because it selectively etches off non-diamond carbon from the substrate such that diamond growth is dominant. However, this selective etching process does not usually remove all the deposited non-diamond carbon and such material therefore becomes incorporated into the CVD diamond material forming defects. Apparatus and process conditions can affect the rate at which non-diamond carbon is incorporated into the solid CVD diamond material being grown.

In light of the above, it is evident that the apparatus configuration and process conditions must be carefully selected and controlled in order to ensure that the level of defects and/or impurities incorporated into the synthetic diamond material during CVD growth are extremely small for high performance optical components.

In addition to control of absolute impurity levels, it is also important to ensure that the uniformity of impurity uptake is controlled so as to achieve a product which has consistent performance characteristics. Uniformity is an issue in terms of spatial variations in the rate of impurity uptake across a growth surface and temporal variations in the rate of impurity uptake over a growth run. For example, a non-uniform distribution of physical and/or chemical process parameters over the growth surface can lead to spatial variations in the rate of impurity uptake across a synthetic polycrystalline diamond wafer and through the thickness of the wafer. Furthermore, as a synthetic polycrystalline diamond wafer grows, grains increase in size as do boundaries between the grains within the synthetic polycrystalline diamond wafer. An increase in the size of grains and grain boundaries as the synthetic polycrystalline diamond wafer grows thicker leads to an increase in the rate of defect and/or impurity uptake within the enlarged grain boundaries which can result in an increasing concentration of defects and/or defects and/or impurities through the thickness of a synthetic polycrystalline diamond wafer.

In addition to the above described problems, variations in growth rate across a synthetic polycrystalline diamond wafer can lead to variations in impurity uptake.

For example, as the growth rate increases the time available to etch non-diamond carbon from the growth surface before it is encapsulated within the synthetic polycrystalline diamond wafer decreases. Furthermore, variations in growth rate also cause variations in thickness which can lead to strain and cracking of synthetic polycrystalline diamond wafer on cooling after completion of the CVD growth process. Variations in growth rate can be caused by non-uniformities in the plasma across the growth surface and non-uniformities in the temperature of the substrate on which the synthetic polycrystalline diamond wafer is grown.

Despite the above problems, to date it has been possible to fabricate high optical quality polycrystalline diamond wafers up to approximately 100 mm in diameter and 1 mm in thickness. However, the production of larger and/or thicker polycrystalline diamond wafers of high optical quality is more difficult. While it has been possible to fabricate larger and/or thicker polycrystalline diamond wafers, these have usually been of lower optical quality in terms of absorption coefficient, scatter, transmitted wave front, etc. Such wafers do not meet the requirements for certain commercial applications which require relatively thick and sometimes relatively large diameter synthetic polycrystalline diamond windows of extremely high optical quality. For example, certain very high powered laser beam applications require >60 mm diameter, >1.2 mm thick clear aperture, optical grade, polycrystalline diamond laser windows capable of handling the extreme power densities involved. Polycrystalline diamond laser windows with the relevant optical properties are available in smaller sizes and thicknesses. However these sizes and thicknesses are not high enough for certain applications. Such polycrystalline diamond windows are also required for use as radiation resistant windows.

Element Six have previously filed a number of patent applications directed to microwave plasma activated CVD reactor hardware and CVD diamond synthesis methodology for achieving high quality, thick CVD diamond growth of both single crystal and polycrystalline CVD diamond materials over relatively large areas and relatively high growth rates. These patent applications include patent applications describing certain aspects of the structure and geometry of the microwave plasma chamber (e.g. WO2012/084661 which describes the use of a compact $TM_{011}$ resonance mode plasma chamber configuration and WO2012/084657 which describes the provision of a plasma stabilizing annulus projecting from a side wall of the plasma chamber), certain aspects of the microwave power coupling configuration (e.g. WO2012/084658 which describes a microwave power delivery system for supplying microwave power to a plurality of microwave plasma reactors and WO2012/084659 which describes a microwave coupling configuration comprising an annular dielectric window, a coaxial waveguide, and a waveguide plate comprising a plurality of apertures disposed in an annular configuration for coupling microwaves towards the plasma chamber), certain aspects of the substrate preparation, geometry, and temperature control configurations within the microwave plasma chamber (e.g. WO2012/084655 which describes how to prepare, locate, and control substrate parameters within a microwave plasma reactor to achieve desirable electric field and temperature profiles), and certain aspects of the gas flow configuration and gas flow parameters within a microwave plasma chamber (e.g. WO2012/084661 which describes a microwave plasma reactor with a multi-nozzle gas inlet array having a desirable geometric configuration for achieving uniform diamond growth over large areas and WO2012/084656 which describes the use of high gas flow rates and injection of process gases with a desirable Reynolds number to achieving uniform doping of synthetic diamond material over large areas).

The aforementioned CVD reactor technology is capable of generating a uniform plasma over a large growth area and can provide precise and uniform temperature management across the growth substrate at high microwave power density, high pressures, and high gas flow rates over a large growth area. Using this microwave plasma reactor technology it is possible to grow polycrystalline diamond wafers by chemical vapour deposition on a suitable substrate such as a silicon, silicon carbide, or silicon cemented diamond wafer, or a carbide forming refractory metal disk. Such polycrystalline CVD diamond wafers are generally opaque in their as-grown form but can be made transparent by polishing the surfaces of the wafers to reduce optical scatter and produce transparent polycrystalline diamond windows for optical applications.

Element Six has also described the use of the aforementioned microwave plasma reactor technology in order to fabricate thick (e.g. at least 1.3 mm), large area (e.g. at least 70 mm diameter) synthetic polycrystalline diamond windows having extremely high optical quality across substantially all (e.g. across at least 70%) of the window area. For example, WO2013/087702 and WO2013/087797 describe such processes and products.

One problem which has been found when growing polycrystalline CVD diamond wafers to large thicknesses is that while it is possible to control the growth process to achieve low absorption coefficient material, a plurality of microfeatures in the form of small micro-cracks that appear dark in colour are formed in the material as it grows to thicknesses in excess of 800 µm, and particularly for thicknesses of 1 mm or more, which are not present in the material at lower thicknesses. Such microfeatures vary in size and distribution across the polycrystalline CVD diamond wafer. Typically, they have a size between 0.002 $mm^2$ and 0.1 $mm^2$ and can be detected as black features using optical microscopy or simple visual inspection. Hundreds or even thousands of such dark microfeatures can be formed when growing polycrystalline CVD diamond material to thicknesses in excess of 1 mm. FIG. 1 is a schematic plan view of the growth face of a thick polycrystalline CVD diamond wafer comprising a plurality of microfeatures. It should be noted that these microfeatures only begin to appear at the growth surface of the polycrystalline CVD diamond wafer after 0.8 to 1 mm of growth.

Such microfeatures are a problem for new high power laser windows, particularly for very high beam power applications such as extreme ultraviolet lithography (EUVL) pump systems. The microfeatures can cause additional absorption above the intrinsic absorption and that caused by point defects in the diamond material (such as nitrogen). The micro features can also cause additional optical scatter above the intrinsic scatter of polycrystalline CVD diamond as a result of its grain structure. Further still, it has been found that where microfeatures break the external surface of a polycrystalline CVD diamond wafer this can lead to difficulties with surface processing when lapping and polishing the wafer to produce a suitable surface finish for an optical window. For example, the wafer can be preferentially processed at the location of the microfeatures leading to pits forming in the surface and a degradation in the flatness and roughness of the surface finish. This pitting can also lead to issues when applying an optical coating, such as an antireflective coating, to the diamond window.

Furthermore, this pitting in combination with surface and near surface microfeatures can lead to problems when applying a surface pattern, such as a diffractive grating, zone plate, or an antireflective moth-eye type surface finish, to the optical component as described, for example, in WO2014135544 and WO2014135547.

In light of the above, it is an aim of embodiments of the present invention to solve this problem and provide thick polycrystalline CVD diamond wafers which have both a low bulk absorption coefficient and also a low density of microfeatures.

SUMMARY OF INVENTION

According to a first aspect of the present invention there is provided a polycrystalline chemical vapour deposited (CVD) diamond wafer comprising:
a diameter ≥40 mm;
a thickness ≥1.0 mm;
an absorption coefficient ≤0.1 cm$^{-1}$ at 10.6 μm; and
a microfeature density meeting the following specification:
  in a central area of the polycrystalline CVD diamond wafer from 0 to 20 mm radius there are no more than 100 microfeatures of a size between 0.002 and 0.008 mm$^2$, no more than 50 microfeatures of a size between 0.008 and 0.018 mm$^2$, no more than 25 microfeatures of a size between 0.018 and 0.05 mm$^2$, and zero microfeatures of a size between 0.05 and 0.1 mm$^2$, and
  in an outer region of the polycrystalline CVD diamond wafer from 20 to 40 mm radius there are no more than 200 microfeatures of a size between 0.002 and 0.008 mm$^2$, no more than 150 microfeatures of a size between 0.008 and 0.018 mm$^2$, no more than 100 microfeatures of a size between 0.018 and 0.05 mm$^2$, and zero microfeatures of a size between 0.05 and 0.1 mm$^2$.

Embodiments of the present invention thus provide polycrystalline CVD diamond wafers which combine a relatively large diameter and thickness with a low bulk absorption coefficient and a low density of microfeatures. It has been found that the number of microfeatures which can be tolerated for high power applications is dependent on the size and position of the microfeatures. Smaller microfeatures are less problematic than larger microfeatures. Furthermore, microfeatures in a peripheral region of the polycrystalline CVD diamond wafer are less problematic than microfeatures located in the central region of the wafer.

BRIEF DESCRIPTION OF THE DRAWINGS

For a better understanding of the present invention and to show how the same may be carried into effect, embodiments of the present invention will now be described by way of example only with reference to the accompanying drawings, in which:

FIG. 1 is a schematic plan view of the growth face of a thick (>1 mm) polycrystalline CVD diamond wafer comprising a plurality of microfeatures.

DETAILED DESCRIPTION

Details of suitable microwave plasma reactor technology are provided in WO2012/084661, WO2012/084657, WO2012/084658, WO2012/084659, WO2012/084655, WO2012/084661, and WO2012/084656. Furthermore, WO2013/087702 and WO2013/087797 describe improvements to this microwave plasma reactor technology and its use in fabricating thick, large area polycrystalline CVD diamond wafers.

Microfeatures in the form of black spots were mentioned in both WO2013/087702 and WO2013/087797. It was indicated that a polycrystalline CVD diamond wafer preferably has an average black spot density no greater than 1 mm$^{-2}$, 0.5 mm$^{-2}$, or 0.1 mm$^{-2}$ and/or a black spot distribution such that there are no more than 4, 3, 2, or 1 black spots within any 3 mm$^2$ area. However, it has been found to be difficult to provide a polycrystalline CVD diamond wafer which combines a relatively large diameter and thickness with a low bulk absorption coefficient and a low density of microfeatures. As such, research work following WO2013/087702 and WO2013/087797 has focussed on modifying the polycrystalline CVD diamond growth conditions to produce thick polycrystalline CVD diamond wafers which have low bulk absorption coefficient and a low density of microfeatures. In addition, a greater appreciation of how the size and location of microfeatures affects functional performance has led to a modification in the product specification away from a basic microfeature density and distribution criteria for the polycrystalline CVD diamond wafer to a specification as set out in the summary of invention section which takes into account the size and location of the microfeatures across the polycrystalline CVD diamond wafer.

It has been found that typically nitrogen addition into the CVD growth chamber can aid in reducing the density of micro features in thick polycrystalline CVD diamond material. However, nitrogen itself contributes significantly to the optical absorption of the polycrystalline CVD diamond material. As such, it has been found that a balance must be struck between adding sufficient nitrogen to reduce the density of microfeatures while not adding too much nitrogen that optical absorption is unduly increased. That is, a gas phase nitrogen concentration window can be identified for the synthesis of thick optical grade polycrystalline CVD diamond material which results in the best compromise between absorption from nitrogen and absorption from microfeatures in the thick polycrystalline CVD diamond product material. This nitrogen window has been found to be in the range 400 to 550 parts per billion (ppb), more preferably 425 to 460 ppb, nitrogen in the CVD synthesis atmosphere as calculated from optical emission spectroscopy (OES) measurements and/or calculated based on input gas flows.

It is also important to balance methane and nitrogen concentrations in the gas phase during synthesis. A relatively low methane concentration is utilized as otherwise the nitrogen added to the synthesis process would result in a higher growth rate, lower quality polycrystalline CVD diamond product wafer. For example, during the main growth stage the CVD synthesis atmosphere may be controlled to have a methane concentration in a range 0.8 to 1.5%. One option is to utilize a higher methane concentration during the nucleation stage of diamond growth and then drop the methane concentration for the main growth stage. This ensures good nucleation while also ensuring that the methane concentration is not too high during the main growth stage. The methane concentration can be further reduced in a stepwise or continuous fashion during the main growth stage to maintain the quality of the polycrystalline CVD diamond material as is grows thicker.

In addition, or as an alternative, to adding a higher concentration of methane during nucleation and then reducing the methane during the main CVD diamond growth stage, it has also been found to be advantageous to add a higher concentration of nitrogen during nucleation and then reduce the nitrogen concentration during the main diamond growth stage. For example, 2 to 8 ppm nitrogen may be provided in the CVD synthesis atmosphere during diamond nucleation and then the nitrogen level dropped to a level in the range 400 to 550 ppb for the main diamond growth stage.

As an alternative, or in addition, to using a higher nitrogen and/or methane concentrations during the diamond nucleation phase and then dropping the concentrations during the main diamond growth phase, it is advantageous to provide one or more of:
- a stepped or continuous reduction in substrate temperature (by adjusting the temperature control system for the substrate);
- a stepped or continuous reduction in microwave power input to the growth chamber (by adjusting the microwave power source); and
- a stepped or continuous increase in pressure within the growth chamber (by regulating gas flow).

Again, the adjustment of these parameters during the growth run aids in maintaining the quality of the polycrystalline CVD diamond material as is grows thicker. The example described later in this specification uses a combination of a stepwise decrease in substrate temperature, a stepwise decrease in power, and a stepwise increase in pressure during growth of the polycrystalline CVD diamond wafer.

Nucleation temperature, in addition to nucleation chemistry, is another factor which has been found to affect microfeature formation in thick polycrystalline CVD diamond wafers. This is surprising and somewhat counterintuitive as microfeatures only tend to form after 800 µm to 1 mm of polycrystalline CVD diamond growth. That being the case, one would not expect that this phenomenon would be particularly sensitive to conditions during the nucleation stage at the start of diamond growth. However, the present inventors have found that microfeature formation later in the growth run is affected by the conditions during nucleation at the start of the growth run and that it is advantageous to initiate nucleation at a lower temperature prior to ramping up to full growth conditions. For example, power and pressure can initially be ramped up to an intermediate stage below the main growth conditions, methane introduced to initiate nucleation, and then the power and pressure can be further ramped up to full growth conditions. For example, methane may be added at a substrate temperature in a range 550° C. to 650° C., nucleation may occur at a central substrate temperature in a range 800° C. to 840° C., before ramping up to a starting growth temperature in a range 875° C. to 920° C. Substrate temperature can be measured using calibrated optical pyrometry operating at 2.2 micrometres and assuming an emissivity of 0.9. Variations are possible in terms of the exact temperatures at which methane addition, nucleation, and the main growth stage occur. The important feature is that methane is added and nucleation occurs at a significantly lower temperature than the main diamond growth temperature for the thick polycrystalline CVD diamond wafer.

Furthermore, during growth the edge temperature of the polycrystalline CVD diamond wafer is lower than the central temperature with a temperature differential within 60° C. Temperature is controlled as described in WO2013/087702 and WO2013/087797 utilizing a gas gap and adjustable gas flow under the substrate in combination with the provision of a metallic temperature modifying ring disposed around the substrate. The stepped reduction in substrate temperature as previously described is relatively small compared with the absolute starting temperature during growth. For example, the substrate temperature may be reduced in three 20° C. steps during polycrystalline CVD diamond growth.

High power, pressure, and gas flow rate are utilized during polycrystalline CVD diamond growth. For example, total gas flow may be in a range 2800 standard cubic centimetres per minute (sccm) to 3700 sccm. This may comprise a hydrogen flow rate in a range 2500 to 3500 sccm, a methane flow rate in a range 25 to 50 sccm, optionally 20 to 50 sccm of argon, and nitrogen added to a concentration of 400 to 550 ppb. Microwave power may be in a range 25 to 28 kW, and pressure may be in a range 180 to 220 Torr. Again, stepped changes in these parameters during growth are relatively small compared with absolute starting values. For example, pressure may be raised by 5 to 10 Torr during growth whereas power may be reduced by 1 to 2 kW during growth in order to maintain the quality of the polycrystalline CVD diamond material as it grows up to and beyond 1 mm in thickness.

Synthesis parameters as described above are selected in order to control the growth texture of the polycrystalline CVD diamond material while maintaining intrinsic material quality for optical applications. It is important to understand that the texture of the material in the early stages of polycrystalline CVD diamond growth has a significant impact on the material quality in the later stages of polycrystalline CVD diamond growth as discussed below.

As nominally transparent polycrystalline CVD diamond is grown to greater thickness (typically >1 mm thick), phenomena of defect uptake and intergranular competition and its resultant stresses begin to impact the aesthetic appearance and potential optical performance of the material. A major contributor to this is the formation of microfeatures in later growth. For the purposes of this specification, microfeatures are dark spots detected and counted using the microfeature density measurement method as described later in this specification. In terms of a physical explanation as to what microfeatures actually are, one definition is that a microfeature is a cluster of microfractures. The microfractures can cause reflections resulting in high angle scatter and, when they contain non-diamond carbon, increase optical absorption. That is, microfeatures may be formed of a discrete network of microscopic fractures within the continuous diamond structure, the internal faces of which are decorated with non-diamond carbon. These features appear opaque under the conditions used to image and analyse them as documented herein.

It is unknown whether micro features initiate as the material is growing, or whether they are a result of the cooling process from growth conditions to atmospheric temperatures and pressures, but they are present in all nominally transparent CVD diamond films of sufficient thickness, and it is known that for a given material type, the number density and size distribution of microfeatures increases with both material thickness and growth rate. With increasing growth rate and thickness, the number of microfeatures and distribution of microfeature sizes increases, eventually to the point where, for fast-growing, thick CVD diamond (e.g. >3.0 mm thick), discrete clusters of microscopic fractures coalesce into a visually continuous network of microscopic fractures. Historically, for a given diamond film thickness, the initiation of such features has be delayed by slowing the growth rate, reducing the aggressiveness of intergranular competition.

CVD diamond films nucleate and early growth initiates with thousands of grains per mm², however different relative lateral and vertical growth rates between grains and their neighbours result in local granular competition for space and an evolution of the crystallographic properties of the diamond film, eventually towards a single, dominant crystallographic texture. The extinction of particular growth directions and overgrowth of slower-growing neighbouring grains is a major source of stress relief for the growing film, but in later growth, as the distribution of growth directions narrows, that stress relief mechanism is decreasingly available. The single dominant texture and the rate at which that texture evolves from a near-random distribution at nucleation to become pure, depends on the relative growth rates of different crystallographic directions, defined by the synthesis parameters used for growth, i.e. [N]/[C]/substrate temperature/power density/chamber pressure.

However, it has been observed that as the overall texture of the growing top face tends towards 100% <110> orientation (perpendicular to the substrate surface), a second distribution of isolated, large microfeatures starts to emerge. This type of feature is aesthetically unattractive but is also more prone to cracking and chipping during polishing than the usual smaller micro features and will contribute to reduced optical performance. The <110> growth texture tends to dominate more quickly in slower growing wafers, which would be assumed to be of higher optical quality.

A parameter window exists between these two situations where diamond growth is slow enough to maintain the optical absorption and sufficiently low numbers of smaller microfeatures initiate in thicker material (~1.5 mm thick), but the resultant texture evolution rate is limited, so that the proportion of grains with a <110> growth direction does not reach the required level to initiate the formation of the isolated, large micro features. Diamond growth on either side of this parameter window would result in material unsuitable for use in demanding optical applications such as for extreme ultraviolet lithography (EUVL). That is, using a growth process optimized to achieve polycrystalline CVD diamond material having a low optical absorption and a low concentration of small microfeatures results in the formation of large microfeatures when grown to high thicknesses. Conversely, using a growth process optimized to achieve polycrystalline CVD diamond material having a low concentration of large microfeatures when grown to high thicknesses results in a material which has higher optical absorption and a higher concentration of small microfeatures. It is important to note that there are two distinct types of microfeatures (small and large) which are affected in different ways by changes to the growth conditions. The growth parameters as described herein represent a window in parameter space to achieve polycrystalline CVD diamond material having a low optical absorption, a low concentration of small microfeatures, and a low concentration of large microfeatures.

Using the aforementioned methodology, it is possible to fabricate a polycrystalline CVD diamond wafer comprising:
a diameter ≥40 mm, ≥50 mm, ≥60 mm, ≥70 mm, ≥80 mm, ≥90 mm, or ≥100 mm (optionally less than 150 mm, 130 mm, or 110 mm);
a thickness ≥1.0 mm, ≥1.1 mm, ≥1.2 mm, ≥1.3 mm, ≥1.4 mm, or ≥1.5 mm (optionally less than 2 mm);
an absorption coefficient ≤0.1 cm$^{-1}$, more preferably ≤0.09 cm$^{-1}$, ≤0.08 cm$^{-1}$, ≤0.07 cm$^{-1}$, or ≤0.06 cm$^{-1}$, at 10.6 µm (optionally no less than 0.03 cm$^{-1}$); and
a microfeature density meeting the following specification:
in a central area of the polycrystalline CVD diamond wafer from 0 to 20 mm radius there are no more than 100 microfeatures of a size between 0.002 and 0.008 mm$^2$, no more than 50 microfeatures of a size between 0.008 and 0.018 mm$^2$, no more than 25 microfeatures of a size between 0.018 and 0.05 mm$^2$, and zero microfeatures of a size between 0.05 and 0.1 mm$^2$, and
in an outer region of the polycrystalline CVD diamond wafer from 20 to 40 mm radius there are no more than 200 microfeatures of a size between 0.002 and 0.008 mm$^2$, no more than 150 microfeatures of a size between 0.008 and 0.018 mm$^2$, no more than 100 microfeatures of a size between 0.018 and 0.05 mm$^2$, and zero microfeatures of a size between 0.05 and 0.1 mm$^2$.

Preferably the polycrystalline CVD diamond wafer meets the more restrictive criteria for microfeature density as follows:
in the central area of the polycrystalline CVD diamond wafer from 0 to 20 mm radius there are no more than 50 microfeatures of a size between 0.002 and 0.008 mm$^2$, no more than 10 microfeatures of a size between 0.008 and 0.018 mm$^2$, no more than 5 microfeatures of a size between 0.018 and 0.05 mm$^2$, and zero microfeatures of a size between 0.05 and 0.1 mm$^2$, and
in the outer region of the polycrystalline CVD diamond wafer from 20 to 40 mm radius there are no more than 100 microfeatures of a size between 0.002 and 0.008 mm$^2$, no more than 20 microfeatures of a size between 0.008 and 0.018 mm$^2$, no more than 10 microfeatures of a size between 0.018 and 0.05 mm$^2$, and zero microfeatures of a size between 0.05 and 0.1 mm$^2$.

While it is advantageous to have zero microfeatures of any size at any position on the polycrystalline CVD diamond wafer, many wafers will still have a small number of microfeatures but well within the tolerable specification. For example, lower limits for microfeature density may be defined as follows:
in the central area of the polycrystalline CVD diamond wafer from 0 to 20 mm radius there are no less than 5 microfeatures of a size between 0.002 and 0.008 mm$^2$, no less than 1 microfeatures of a size between 0.008 and 0.018 mm$^2$, zero microfeatures of a size between 0.018 and 0.05 mm$^2$, and zero microfeatures of a size between 0.05 and 0.1 mm$^2$, and
in the outer region of the polycrystalline CVD diamond wafer from 20 to 40 mm radius there are no less than 10 microfeatures of a size between 0.002 and 0.008 mm$^2$, no less than 2 microfeatures of a size between 0.008 and 0.018 mm$^2$, zero microfeatures of a size between 0.018 and 0.05 mm$^2$, and zero microfeatures of a size between 0.05 and 0.1 mm$^2$.

Of course, there should also be zero microfeatures anywhere in the region from 0 to 40 mm radius which are larger than 0.1 mm$^2$. Outside of the 40 mm radius region, more micro features can be tolerated as in use only the central region of the wafer is disposed in the light path.

The polycrystalline CVD diamond wafer may also have one or more of the following characteristics:
a thermal conductivity of at least 1900 Wm$^{-1}$K$^{-1}$, preferably at least 2000 Wm$^{-1}$K$^{-1}$ (optionally no more than 2200 Wm$^{-1}$K$^{-1}$);
a fracture strength of at least 400 MPa (optionally no more than 1000 MPa) with a growth face of the polycrystalline CVD diamond wafer in tension and a fracture strength of at least 800 MPa (optionally no more than 1400 MPa) with a nucleation face of the polycrystalline CVD diamond wafer in tension; and
a total integrated scatter in a forward hemisphere no more than 1%, 0.5%, or 0.1% at 10.6 µm for a sample thickness between 1 mm and 1.5 mm with front and rear surfaces polished to a root mean squared roughness of less than 15 nm.

The polycrystalline CVD diamond wafer may also have a nitrogen concentration ($N_s^0$) in a range 500 to 600 ppb as measured by EPR.

In addition to the improved optical performance of thick wafers of polycrystalline CVD diamond as described herein, the reduction in micro features also allows such wafers to be more readily surface processed to high flatness and low roughness without microfeatures causing large pits to be formed in the wafer during processing. For example, the polycrystalline CVD diamond wafer may be processed to have a surface roughness no more than 40 nm, 20 nm, or 10 nm without microfeatures causing large pits to be formed in the processed surface. Furthermore, an antireflective or diffractive structure may be readily formed in or on a surface of the polycrystalline CVD diamond wafer.

Measurement Techniques

Absorption Coefficient

Laser calorimetry is the method of choice for measuring the absorptance of low loss materials and optical components. Details of this measurement can be found in *Test method for absorptance of optical laser components* ISO/FDIS 11551, International Organisation for Standardisation, Geneva (1995) and G. Turri et al, *Optical absorption, depolarization, and scatter of epitaxial single-crystal chemical-vapor-deposited diamond at 1.064 μm*, Optical Engineering 46(6), 064002 (2007). Laser calorimetry involves measuring the time-dependent rise and fall in temperature of a test specimen exposed to a laser of known power for a fixed time period. From an analysis of the temperature response of the specimen, the absorbance A can be determined, where A is defined as the fraction of incident laser power absorbed by the specimen. When the product of the absorption coefficient α with the sample thickness d is much less than unity, then $\alpha \approx A/d$. This approximation is reasonable for optical quality polycrystalline diamond. In addition, optical quality polycrystalline diamond is commonly used for $CO_2$ laser optics operating at 10.6 μm. Performing the laser calorimetry measurement using the 10.6 μm line of a $CO_2$ laser is therefore particularly appropriate for the present invention. Test specimens for calorimetry are prepared as follows. Firstly the growth and nucleation faces of the wafer are lapped and polished to a uniform, desired thickness. A minimum of 20 μm is polished off the nucleation face in order to remove any contamination which may have incorporated during the nucleation stage of synthesis. Secondly, a series of calorimetry test specimens are laser machined from the polished wafer. These specimens are further polished on both sides to an rms roughness of <15 nm.

Tensile Strength

Strength testing of materials can be performed using different techniques, all of which have their advantages and disadvantages. These are well-known to persons skilled in the art. One method of testing for strength is the so-called 3-point bend test. The application of this technique to polycrystalline diamond specimens is detailed in Philosophical Magazine Vol. 83, No. 36, 4059-4070 (2003), *Strength of free-standing chemically vapour-deposited diamond measured by a range of techniques*, A. R. Davies, J. E. Field, C. S. J. Pickles. An as-grown CVD wafer is prepared for 3-point bend strength testing as follows. First, the growth face of the wafer is lapped and polished to a uniform, desired thickness. Secondly, a series of 40 rectangular strength test specimens of lateral dimension 18 mm×2 mm are laser machined from the polished wafer. These specimens are extracted from across the entire wafer in order to provide an even sampling. The 3-point bend test is performed on a first 20 samples in which the nucleation face is in tension and a second 20 samples in which the growth face is in tension. The mean strength of the nucleation and growth faces is determined by calculating the arithmetic mean of each sample set.

Microfeature Density

A partially automated method for analysis of micro feature density and size distribution within specific regions of processed polycrystalline CVD diamond wafers has been devised. Cleanliness during preparation and image capture is of utmost importance as contamination, dust and fibres can skew measurements.

Sample Preparation:

The polycrystalline diamond wafer must be planarised and polished on both faces. If any surface texture remaining from the grinding stage is included in the measurement, the procedure will give an inaccurate representation of the microfeature density.

Following polishing, the wafer should be thoroughly cleaned, so that the surface is free from particles, residual glue or other contaminants.

Image Capture:

A clean, dust-free wafer is located centrally on the clean platen of high-resolution imaging system (ideally ≥4800×4800 pixels per inch or 189×189 pixels per mm) with bright field, transmission-mode illumination.

After previewing and cropping the image to the desired region, an image is captured using the following parameters:

8-bit grayscale (256 shades)

High resolution (4800×4800 pixels per inch)

Transmission-mode

The captured image is saved as a .tiff file

Image Analysis:

The full resolution 8-bit .tiff file is uploaded into an image analysis software suite, e.g. ImageJ.

The image scaling (pixels/inch or pixels/mm) is applied, according to the procedure used in capturing the image.

The original image can be cropped to isolate specific regions of the wafer. These can then be analysed separately if required.

For each cropped image, grayscale thresholding is applied to isolate microfeatures (darker, non-transparent regions) from the transparent background.

Each thresholded pixel or cluster thereof (microfeature) is treated as a 'particle' and the number of particles along with their areas are calculated according to the number of pixels.

Output data for each cropped image comprises a list of particles, each with their associated area measurement ($mm^2$)

Statistical Analysis:

For each cropped image, the list of particle areas is copied into a data handling software package such as an MS Excel spreadsheet template.

The entire list of measured particle areas is compiled into a histogram with appropriately spaced bins, according to the data spread, or any pre-defined specifications.

Thermal Conductivity

Thermal conductivity is measured in thick diamond wafers using the proven relationship between thermal conductivity and the $CH_x$ component of the FTIR absorption spectrum. This relationship is described in "Thermal conductivity measurements on CVD diamond", by Twitchen et al, Diamond and related materials, 10 (2001) 731-735. The integrated area of the $CH_x$ components in the region 2760 $cm^{-1}$ to 3030 $cm^{-1}$ of the IR spectrum of the diamond window, once corrected with a linear baseline, has been shown to be quantitatively related to the thermal conductivity of diamond.

Optical Scatter

Total integrated scatter in the forward direction is measured using a so-called Coblentz sphere capable of collecting forward scattered light at an angle ≥2.5° with respect to the incident light beam. The technique is described in J. C. Stover, *Optical Scattering: Measurement and Analysis*, SPIE Press Monograph (1995). The 10.6 μm line of a $CO_2$ laser is used for these measurements. Test specimens for scatter measurements are prepared as follows. Firstly the growth and nucleation faces of the wafer are lapped and polished to a uniform, desired thickness. A minimum of 20 μm is polished off the nucleation face in order to remove any contamination which may have incorporated during the nucleation stage of synthesis. Secondly, a series of test specimens are laser machined from the polished wafer. These specimens are further polished on both sides to an rms roughness of <15 nm.

EXAMPLE

The example given here is for a 100 mm diameter wafer grown to a thickness >1.5 mm. This example targets low microfeature densities, particularly in thick products while maintaining a low absorption coefficient at 10.6 μm. The process detailed below is optimised for achieving high yields of 60-85 mm diameter, 1.3 mm thick optical grade windows from such as-grown wafer. It should be noted that the thickness of the as-grown wafer must be significantly higher than that required for the product as material is removed during lapping and polishing to achieved the desired flatness and roughness criteria for extreme optical applications.

Synthesis conditions are as follows:

| Stage | Nucleation | Growth |
|---|---|---|
| Hydrogen flow | 2950 ± 50 sccm | 2950 ± 50 sccm |
| Methane flow | 35 ± 1 sccm | 35 ± 1 sccm |
| Power | 26.5 ± 0.5 kW | 26.5 ± 0.5 kW |
| Pressure | 206 Torr | 206 Torr |
| Centre Temperature | 820° C. | 900° C. |
| Edge Temperature | ~780-810° C. | ~840-870° C. |
| Gas phase nitrogen concentration | | 425 ± 25 ppb |

| Start-up | Flow process $H_2$ and Ar. Microwaves on, stabilise at 100 Torr (10 kW) |
|---|---|
| 0:00:00 | Ramp to 195 Torr (23 kW) |
| ~0:01:30 | Start $CH_4/N_2$ |
| ~0:03:30 | Complete ramp to 206 Torr (26 kW) |
| ~0:05:30 | Control substrate temperature at 820° C. |
| ~4:00:00 | Increase substrate temperature to 900° C. |

After growth conditions are established a stepped synthesis profile is utilized with respect to substrate temperature, power, and pressure to manage growth rate, control uniformity, and maintain material quality as the wafer grows to high thickness. Substrate temperature is lowered 60° C. during growth in three 20° C. steps; power is reduced by 1.5 kW in three 0.5 kW steps; and pressure is increased by 6 Torr in three 2 Torr steps. Each stepped change is performed slowly over a 1 to 2 hour time interval.

Material properties of the product are as follows:

| Attribute | Method of measurement | Typical value | Lower specification limit | Upper specification limit |
|---|---|---|---|---|
| Thermal Conductivity | Laser Flash | >2000 $Wm^{-1}K^{-1}$ | 1900 $Wm^{-1}K^{-1}$ | N/A |
| Absorption Coefficient @ 10.6 μm | 10.6 μm Laser Calorimetry | 0.060 $cm^{-1}$ | N/A | 0.070 $cm^{-1}$ |
| Fracture Strength | 3-point bend test | 450 MPa (G) 1050 MPa (N) | 400 MPa on growth face 800 MPa on nucleation face | N/A |
| Minimum Wafer Thickness | Micrometry (41 pt) | >1500 μm | 1500 μm | N/A |
| Microfeature Density | High Definition Scan and Image Analysis | See Below | N/A | See Below |

Microfeature Density

Wafers are processed to give a ~1400 μm thick polished plate. Plates are acid cleaned prior to removing all possible dust from the surface. The plate is scanned and the image analysed according to the procedure outlined previously in this specification. Results are indicated in the below table:

| | 0-20 mm | | 20-40 mm | |
|---|---|---|---|---|
| Key Data | Typical | Upper Spec. | Typical | Upper Spec. |
| 0.002-0.008 $mm^2$ | 20-50 | 100 | 40-100 | 200 |
| 0.008-0.018 $mm^2$ | 2-10 | 50 | 5-20 | 150 |
| 0.018-0.05 $mm^2$ | 0-5 | 25 | 0-10 | 100 |
| 0.05-0.1 $mm^2$ | 0 | 0 | 0 | 0 |

While this invention has been particularly shown and described with reference to embodiments, it will be understood to those skilled in the art that various changes in form and detail may be made without departing from the scope of the invention which is defined by the appending claims.

The invention claimed is:

1. A polycrystalline chemical vapour deposited (CVD) diamond wafer comprising:
   a diameter ≥40 mm;
   a thickness ≥1.0 mm;

an absorption coefficient ≤0.1 cm$^{-1}$ at 10.6 μm; and a plurality of microfeatures, wherein the diamond wafer has a microfeature density meeting the following specification:

in a central area of the polycrystalline CVD diamond wafer from 0 to 20 mm radius there are between 5 and 100 microfeatures of a size between 0.002 and 0.008 mm$^2$, between 1 and 50 microfeatures of a size between 0.008 and 0.018 mm$^2$, no more than 25 microfeatures of a size between 0.018 and 0.05 mm$^2$, and zero microfeatures of a size between 0.05 and 0.1 mm$^2$, and in an outer region of the polycrystalline CVD diamond wafer from 20 to 40 mm radius there are between 10 and 200 microfeatures of a size between 0.002 and 0.008 mm$^2$, between 2 and 150 microfeatures of a size between 0.008 and 0.018 mm$^2$, no more than 100 microfeatures of a size between 0.018 and 0.05 mm$^2$, and zero microfeatures of a size between 0.05 and 0.1 mm$^2$.

2. A polycrystalline CVD diamond wafer according to claim 1, wherein the microfeature density meets the following specification:

in the central area of the polycrystalline CVD diamond wafer from 0 to 20 mm radius there are between 5 and 50 microfeatures of a size between 0.002 and 0.008 mm$^2$, between 1 and 10 microfeatures of a size between 0.008 and 0.018 mm$^2$, no more than 5 microfeatures of a size between 0.018 and 0.05 mm$^2$, and zero microfeatures of a size between 0.05 and 0.1 mm$^2$, and in the outer region of the polycrystalline CVD diamond wafer from 20 to 40 mm radius there are between 10 and 100 microfeatures of a size between 0.002 and 0.008 mm$^2$, between 2 and 20 microfeatures of a size between 0.008 and 0.018 mm$^2$, no more than 10 microfeatures of a size between 0.018 and 0.05 mm$^2$, and zero microfeatures of a size between 0.05 and 0.1 mm$^2$.

3. A polycrystalline CVD diamond wafer according to claim 1, wherein the absorption coefficient is ≤0.09 cm$^{-1}$, ≤0.08 cm$^{-1}$, ≤0.07 cm$^{-1}$, or ≤0.06 cm$^{-1}$ at 10.6 μm.

4. A polycrystalline CVD diamond wafer according to claim 1, wherein the diameter of the polycrystalline CVD diamond wafer is equal to or greater than 50 mm, 60 mm, 70 mm, 80 mm, 90 mm, or 100 mm.

5. A polycrystalline CVD diamond wafer according to claim 1, wherein the thickness of the polycrystalline CVD diamond wafer is equal to or greater than 1.1 mm, 1.2 mm, 1.3 mm, 1.4 mm, or 1.5 mm.

6. A polycrystalline CVD diamond wafer according to claim 1, wherein the polycrystalline CVD diamond wafer has a thermal conductivity of at least 1900 Wm$^{-1}$K$^{-1}$.

7. A polycrystalline CVD diamond wafer according to claim 1, wherein the polycrystalline CVD diamond wafer has a fracture strength of at least 400 MPa with a growth face of the polycrystalline CVD diamond wafer in tension and a fracture strength of at least 800 MPa with a nucleation face of the polycrystalline CVD diamond wafer in tension.

8. A polycrystalline CVD diamond wafer according to claim 1, wherein the polycrystalline CVD diamond wafer has a nitrogen concentration in a range 500 to 600 ppb as measured by electron paramagnetic resonance spectroscopy (EPR).

9. A polycrystalline CVD diamond wafer according to claim 1, wherein a total integrated scatter in a forward hemisphere no more than 1%, 0.5%, or 0.1% at 10.6 μm for a sample thickness of 1 mm with front and rear surfaces polished to a root mean squared roughness of less than 15 nm.

* * * * *